United States Patent
Pacheco et al.

(10) Patent No.: US 11,612,022 B2
(45) Date of Patent: Mar. 21, 2023

(54) MAGNETRON FILTER BOARD FOR MICROWAVE OVEN

(71) Applicant: Rockwell Collins, Inc., Cedar Rapids, IA (US)

(72) Inventors: Jorge Pacheco, Culemborg (NL); Martinus J. Coenen, Breda (NL)

(73) Assignee: Rockwell Collins, Inc., Cedar Rapids, IA (US)

( * ) Notice: Subject to any disclaimer, the term of this patent is extended or adjusted under 35 U.S.C. 154(b) by 1135 days.

(21) Appl. No.: 16/215,849

(22) Filed: Dec. 11, 2018

(65) Prior Publication Data
US 2019/0281670 A1    Sep. 12, 2019

Related U.S. Application Data

(60) Provisional application No. 62/641,087, filed on Mar. 9, 2018.

(51) Int. Cl.
*H05B 6/66* (2006.01)
*H01J 23/54* (2006.01)
(Continued)

(52) U.S. Cl.
CPC .............. *H05B 6/666* (2013.01); *H01J 23/15* (2013.01); *H01J 23/54* (2013.01); *H03H 7/12* (2013.01);
(Continued)

(58) Field of Classification Search
CPC .... H05B 6/666; H05B 6/66; H05B 2206/043; H05B 6/6447; H01J 23/15; H01J 23/54; H05K 1/0237
(Continued)

(56) References Cited

U.S. PATENT DOCUMENTS 5,039,824 A * 8/1991 Takashima ........... H05K 1/0228
174/262
5,616,269 A * 4/1997 Fowler ................... H05B 6/666
219/720
(Continued)

FOREIGN PATENT DOCUMENTS

EP    0911961 A1    4/1999
GB    2491587 A  * 12/2012  .............. H01J 23/15
(Continued)

OTHER PUBLICATIONS

Extended EP Search Report dated Jul. 9, 2019 for EP Patent Application No. 19159050.4.

*Primary Examiner* — Tu B Hoang
*Assistant Examiner* — Yeong Juen Thong
(74) *Attorney, Agent, or Firm* — Suiter Swantz pc llo

(57) ABSTRACT

A magnetron filter board for a microwave oven is disclosed. In embodiments, the magnetron filter board includes a printed circuit board with a first trace and a second trace on the printed circuit board. The first trace includes a first end for connecting to a magnetron and a second end for connecting to a power supply unit. The second trace also includes a first end for connecting to the magnetron and a second end for connecting to the power supply unit. The first trace and the second trace can be configured as a radio frequency band-gap filter that mitigates noise associated with the connection between the magnetron and the power supply unit.

20 Claims, 7 Drawing Sheets

(51) Int. Cl.
  *H03H 7/12* (2006.01)
  *H01J 23/15* (2006.01)
  *H05K 1/02* (2006.01)
(52) U.S. Cl.
  CPC ......... *H05B 6/66* (2013.01); *H05B 2206/043* (2013.01); *H05K 1/0237* (2013.01)
(58) Field of Classification Search
  USPC ....... 219/702, 756, 715, 757, 704, 705, 710, 219/711, 723, 758, 690, 681
  See application file for complete search history.

(56) References Cited

U.S. PATENT DOCUMENTS

| | | | |
|---|---|---|---|
| 6,424,959 B1 * | 7/2002 | Bennett, III | ..........  G06F 30/392 |
| | | | 716/135 |
| 2005/0168912 A1 | 8/2005 | Sato et al. | |
| 2014/0140016 A1 | 5/2014 | Lee et al. | |

FOREIGN PATENT DOCUMENTS

| | | |
|---|---|---|
| GB | 2491587 A | 12/2012 |
| JP | 06029084 | 2/1994 |

* cited by examiner

US 11,612,022 B2

MAGNETRON FILTER BOARD FOR MICROWAVE OVEN

CROSS-REFERENCE TO RELATED APPLICATIONS

The present application claims the benefit under 35 U.S.C. § 119(e) of U.S. Provisional Application Ser. No. 62/641,087, filed Mar. 9, 2018, and titled "MAGNETRON FILTER BOARD FOR MICROWAVE OVEN," which is incorporated herein by reference in its entirety.

BACKGROUND

Microwave ovens generate power via magnetrons, or magnetron tubes (MGT) coupled to a high voltage power supply unit (PSU). Whenever a magnetron generates radiated power, however, the cables connecting the PSU to the magnetron's leads may radiate electromagnetic (EM) noise throughout the entire system. If the microwave oven is operated in an aircraft galley or otherwise based in an airworthy environment, this is particularly problematic due to stringent requirements for EM emissions in such an environment. For example, stringent requirements for EM emissions are in place to prevent interference with other aircraft systems operating in the same frequency ranges.

SUMMARY

In an aspect, embodiments of the inventive concepts disclosed herein are directed to a magnetron filter board for a microwave oven. In embodiments, the magnetron filter board includes a printed circuit board with a first trace and a second trace on the printed circuit board. The first trace includes a first end for connecting to a magnetron and a second end for connecting to a power supply unit. The second trace also includes a first end for connecting to the magnetron and a second end for connecting to the power supply unit. The first trace and the second trace can be configured as a radio frequency band-gap filter that mitigates noise associated with the connection between the magnetron and the power supply unit.

This Summary is provided solely as an introduction to subject matter that is fully described in the Detailed Description and Drawings. The Summary should not be considered to describe essential features nor be used to determine the scope of the Claims. Moreover, it is to be understood that both the foregoing Summary and the following Detailed Description are example and explanatory only and are not necessarily restrictive of the subject matter claimed.

BRIEF DESCRIPTION OF THE DRAWINGS

Implementations of the inventive concepts disclosed herein may be better understood when consideration is given to the following detailed description thereof. Such description makes reference to the included drawings, which are not necessarily to scale, and in which some features may be exaggerated and some features may be omitted or may be represented schematically in the interest of clarity. Like reference numerals in the drawings may represent and refer to the same or similar element, feature, or function. In the drawings.

DETAILED DESCRIPTION

Figure 1:
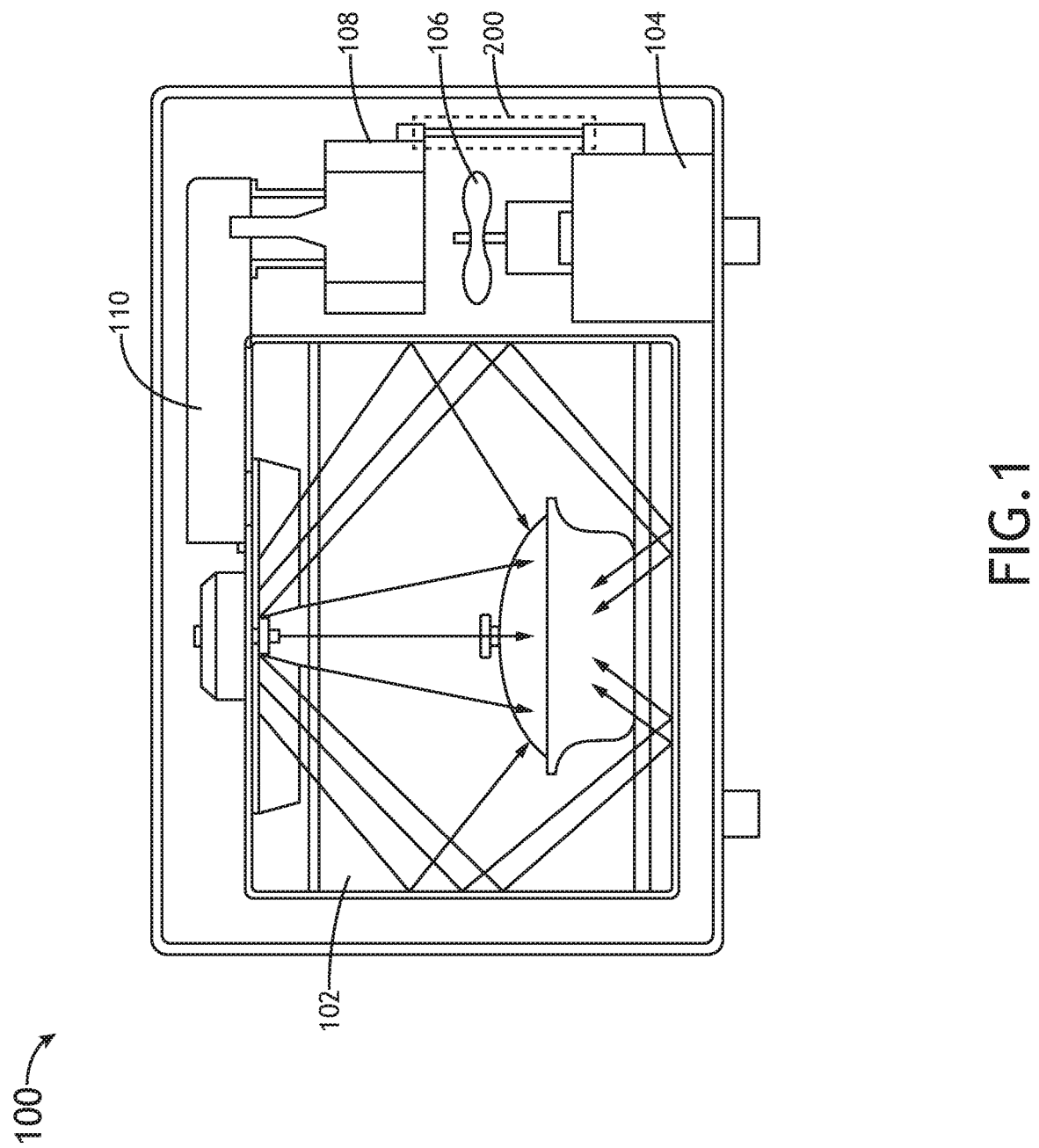
FIG. 1 is a schematic illustration of a microwave oven that can employ a magnetron filter board, in accordance with example embodiments of this disclosure.

Before explaining at least one embodiment of the inventive concepts disclosed herein in detail, it is to be understood that the inventive concepts are not limited in their application to the details of construction and the arrangement of the components or steps or methodologies set forth in the following description or illustrated in the drawings. In the following detailed description of embodiments of the instant inventive concepts, numerous specific details are set forth in order to provide a more thorough understanding of the inventive concepts. However, it will be apparent to one of ordinary skill in the art having the benefit of the instant disclosure that the inventive concepts disclosed herein may be practiced without these specific details. In other instances, well-known features may not be described in detail to avoid unnecessarily complicating the instant disclosure. The inventive concepts disclosed herein are capable of other embodiments or of being practiced or carried out in various ways. Also, it is to be understood that the phraseology and terminology employed herein is for the purpose of description and should not be regarded as limiting.

As used herein a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only, and should not be construed to limit the inventive concepts disclosed herein in any way unless expressly stated to the contrary.

Further, unless expressly stated to the contrary, "or" refers to an inclusive or and not to an exclusive or. For example, a condition A or B is satisfied by anyone of the following: A is true (or present) and B is false (or not present), A is false (or not present) and B is true (or present), and both A and B are true (or present).

In addition, use of the "a" or "an" are employed to describe elements and components of embodiments of the instant inventive concepts. This is done merely for convenience and to give a general sense of the inventive concepts, and "a' and "an" are intended to include one or at least one and the singular also includes the plural unless it is obvious that it is meant otherwise.

Finally, as used herein any reference to "one embodiment," or "some embodiments" means that a particular element, feature, structure, or characteristic described in connection with the embodiment is included in at least one embodiment of the inventive concepts disclosed herein. The appearances of the phrase "in some embodiments" in various places in the specification are not necessarily all referring to the same embodiment, and embodiments of the inventive concepts disclosed may include one or more of the features expressly described or inherently present herein, or any combination of sub-combination of two or more such features, along with any other features which may not necessarily be expressly described or inherently present in the instant disclosure.

Broadly, embodiments of the inventive concepts disclosed herein are directed to magnetron filter board for a microwave oven. The magnetron filter board can include a radio frequency (RF) band-gap filter for mitigation of radiated EM noise at its source. The RF band-bap filter may be based on printed circuit board (PCB) technology in order to provide noise mitigation of a commercial off the shelf (COTS) magnetron without sacrificing reliability by adding extra coils, capacitors, or other components. Due to the requirements for magnetron operability in a microwave oven, each line of the RF band-gap filter may be exposed to high voltage (e.g., 4 kV) and high current (e.g., 6 A). Accordingly, the dielectric and isolating properties of PCB technology may render such technology suitable for the RF band-gap filter. Example embodiments of the magnetron filter board are described below with reference to FIGS. 1 through 7.

FIG. 1 illustrates an example embodiment of a microwave oven 100 that can employ a magnetron filter board 200. The microwave oven 100 may be configured for operation onboard an aircraft. For example, in embodiments, the microwave oven 100 may be designed for installation within an aircraft galley.

The microwave oven 100 includes a cooking chamber 102, a magnetron 108 configured to generate microwave radiation for the cooking chamber 102, and a PSU 104 configured to power the magnetron 108. In some embodiments, the microwave oven 100 includes a plurality of magnetrons or magnetron tubes (MGTs); accordingly, any reference to "magnetron 108" is to be understood as referring to one or more magnetrons, MGTs, or the like. In embodiments, the magnetron filter board 200 connects the magnetron 108 to the PSU 104. For example, the magnetron filter board 200 can be coupled in between the magnetron 108 and the PSU 104 in order to filter EM noise associated with the connection between the magnetron 108 and the PSU 104. The microwave oven 100 may further include a fan 106 configured to cool the magnetron 108 and/or generate air flow for more even heat distribution within the cooking chamber 102. In some embodiments, the microwave oven 100 further includes a waveguide 110 configured to direct and/or distribute the microwave radiation generated by the magnetron 108 into the cooking chamber 102.

Figure 2:
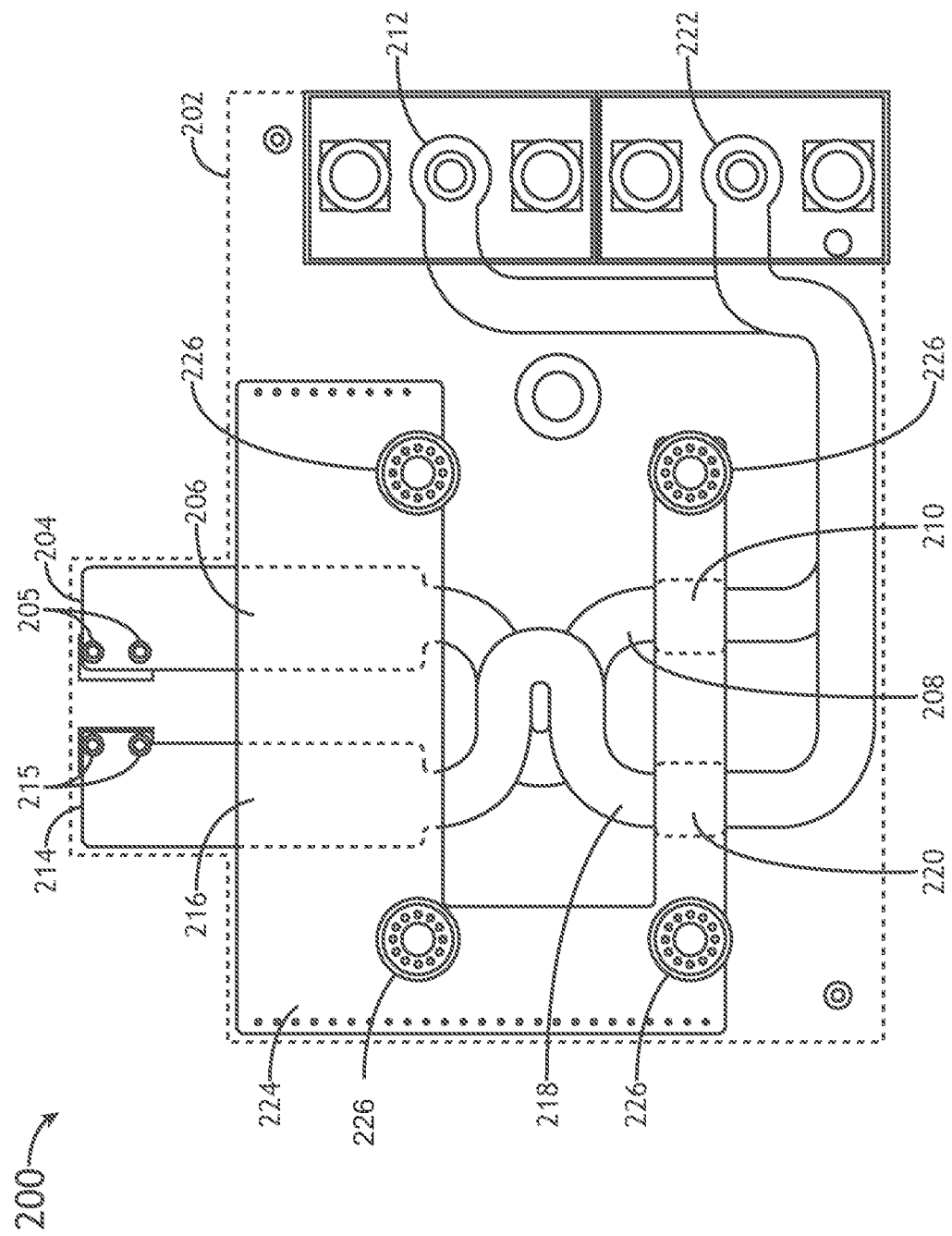
FIG. 2 is a schematic illustration of a magnetron filter board, in accordance with example embodiments of this disclosure.
Figure 3:
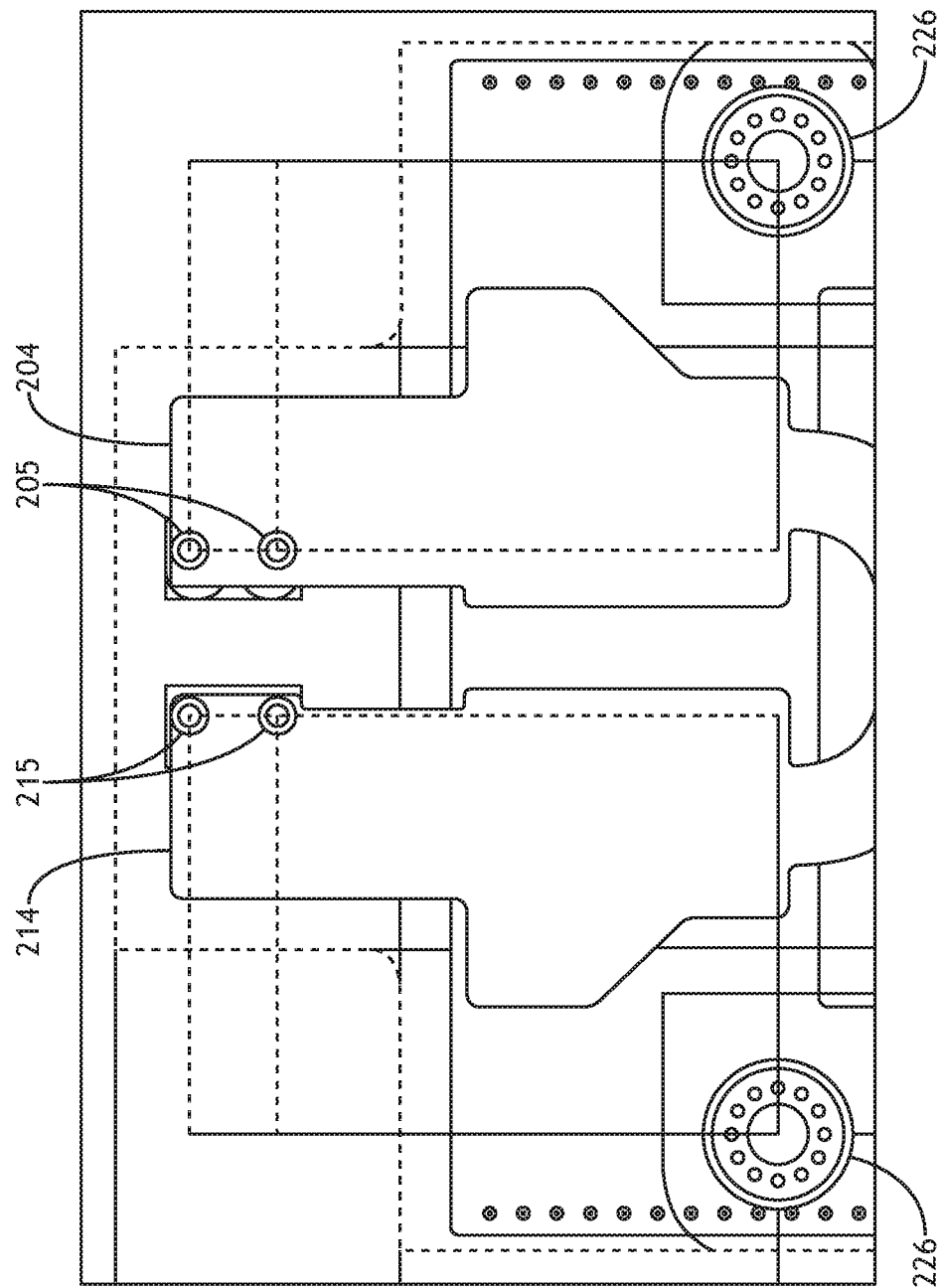
FIG. 3 is a zoomed-in view of a portion of the schematic illustration of the magnetron filter board, in accordance with example embodiments of this disclosure.

An example embodiment of the magnetron filter board 200 is illustrated in FIGS. 2 through 5. As shown in FIG. 2, the magnetron filter board 200 includes a PCB 202 with a first trace 204 and a second trace 214 on the PCB 202. The first trace 204 includes a first end with one or more connectors 205 (e.g., sockets, pins, or the like) for connecting to the magnetron 108 and a second end with one or more connectors 212 (e.g., sockets, pins, or the like) for connecting to the PSU 104. The second trace 214 also includes a first end with one or more connectors 215 (e.g., sockets, pins, or the like) for connecting to the magnetron 108 and a second end with one or more connectors 222 (e.g., sockets, pins, or the like) for connecting to the PSU 104. The first trace 204 and the second trace 214 may be configured to withstand high voltage and high current loads (e.g., a voltage load of 4 kV and a current load of 6 A).

In embodiments, the first end of the first trace 204 is configured to connect to a first terminal of the magnetron 108, and the first end of the second trace is configured to connect to a second terminal of the magnetron 108. For instance, in the example embodiments illustrated in FIG. 2 and FIG. 3 (zoomed-in view), the first end of the first trace 204 may include or may be coupled with one or more connectors 205 (e.g., two through-hole connectors/sockets) configured to receive pins extending from a socket or plug mounted to the PCB 202 for connecting to the terminals of the magnetron 108. Similarly, the first end of the second trace 214 can also include or can be coupled with one or more connectors 205 (e.g., two through-hole connectors/sockets) configured to receive pins extending from the socket or plug mounted to the PCB 202 for connecting to the terminals of the magnetron 108. Those skilled in the art will appreciate that there are a variety of configurations by which the first end of the first trace 204 can be configured to connect to a first terminal of the magnetron 108, and the first end of the second trace can be configured to connect to a second terminal of the magnetron 108. Accordingly, the configurations of the example embodiments illustrated in the drawings and described herein are not intended as limitations on the present disclosure unless otherwise specified in the claims.

In embodiments, the second end of the first trace 204 is configured to connect to a first terminal of the PSU 104, and the second end of the second trace 214 is configured to connect to a second terminal of the PSU 104. For instance, in the example embodiment illustrated in FIG. 2, the second end of the first trace 204 may include or may be coupled with one or more connectors 212 (e.g., a through-hole connector/socket) configured to receive a connector (e.g., pin, lead, plug, cable, or the like) for the first terminal of the PSU 104. Similarly, the second end of the second trace 214 may include or may be coupled with one or more connectors 222 (e.g., a through-hole connector/socket) configured to receive a connector (e.g., pin, lead, plug, cable, or the like) for the second terminal of the PSU 104. Those skilled in the art will appreciate that there are a variety of configurations by which the second end of the first trace 204 can be configured to connect to a first terminal of the PSU 104, and the second end of the second trace can be configured to connect to a second terminal of the PSU 104. Accordingly, the configurations of the example embodiments illustrated in the drawings and described herein are not intended as limitations on the present disclosure unless otherwise specified in the claims.

The first trace 204 and the second trace 214 can be configured as a RF band-gap filter that mitigates noise associated with the connection between the magnetron 108 and the PSU 104. In some embodiments, the PCB 202 further includes or is coupled to a dielectric layer 224 that, with the first trace 204 and the second trace 214, is configured to implement portions of the RF band-gap filter. The dielectric layer 224 may be printed on, mounted to, or otherwise disposed upon the PCB 202. In embodiments, the dielectric layer 224 may comprise a portion of the PCB 202 that does not contain metal (e.g., copper). In some embodiments, the dielectric layer 224 is made of a glass-reinforced epoxy laminate material (e.g., FR4/FR-4, or the like).

Figure 4:
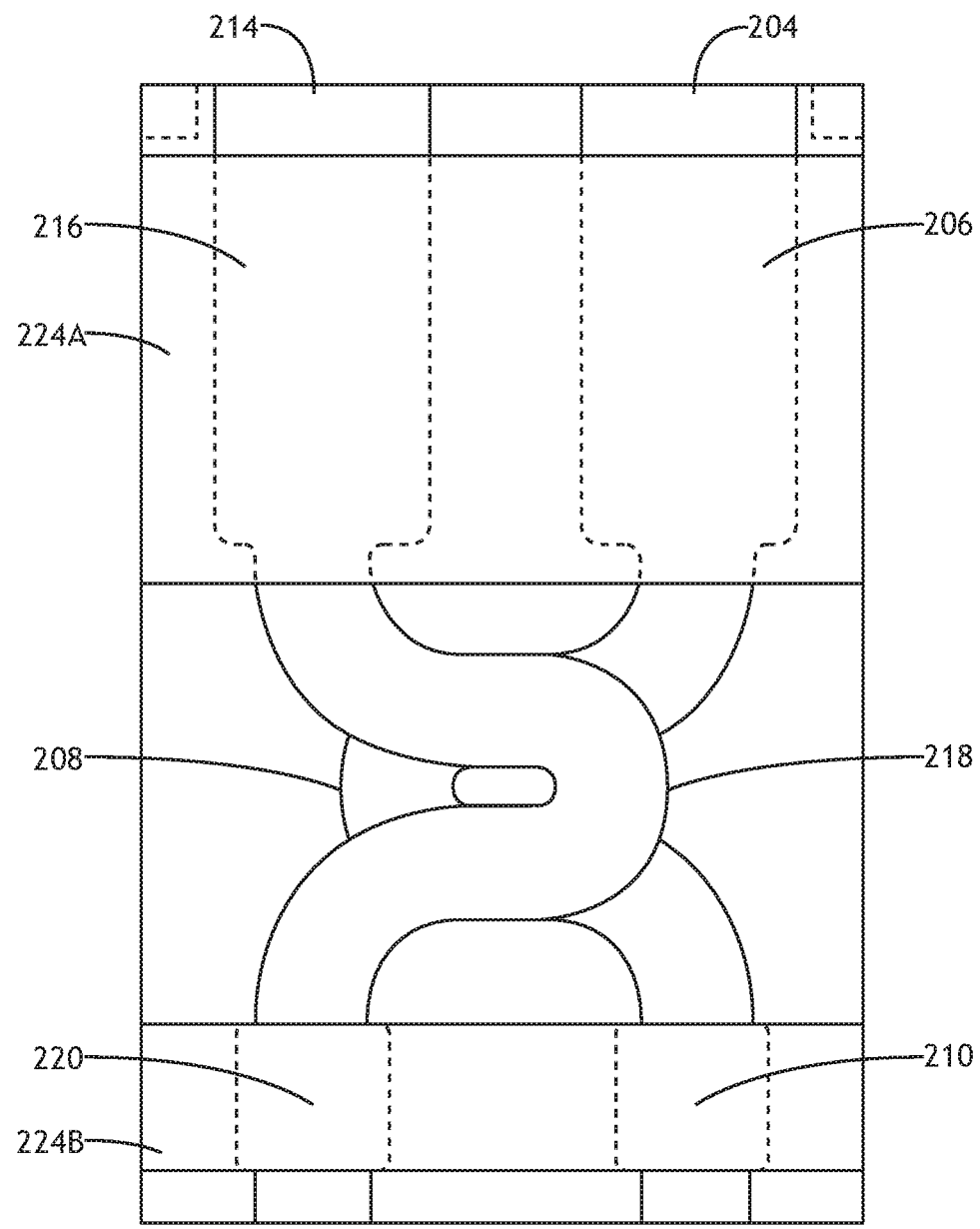
FIG. 4 is a zoomed-in view of a portion of the schematic illustration of the magnetron filter board, in accordance with example embodiments of this disclosure.
Figure 5:
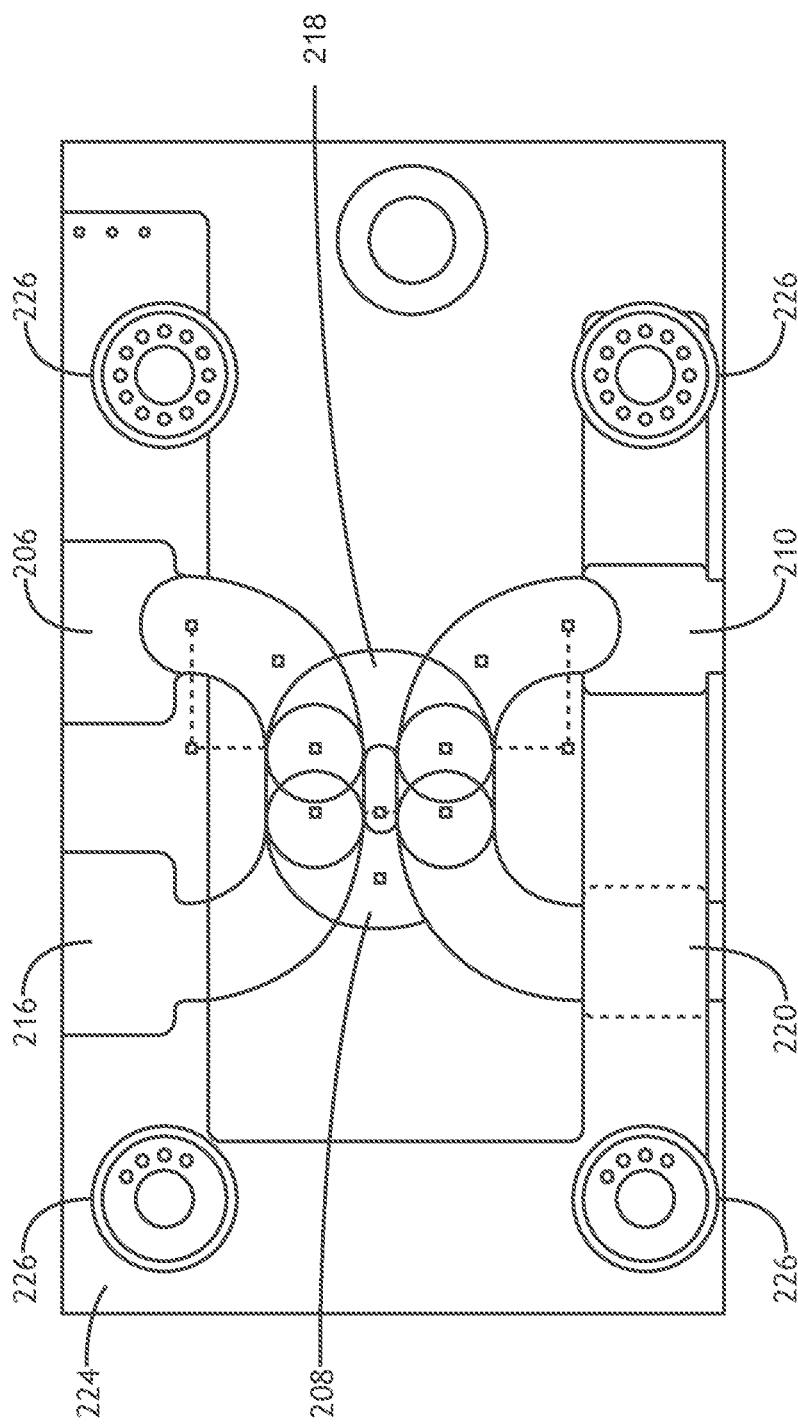
FIG. 5 is a zoomed-in view of a portion of the schematic illustration of the magnetron filter board, in accordance with example embodiments of this disclosure.

As shown in FIG. 4, a first portion 206 of the first trace 204 and a first portion 216 of the second trace 214 may intersect with a first portion 224A of the dielectric layer 224, resulting in a first capacitance (C1) associated with the first portion 206 of the first trace 204 and a second capacitance (C2) associated with the first portion 216 of the second trace 214. Meanwhile, as shown in FIG. 5, a second portion 208 of the first trace 204 and a second portion 218 of the second trace 214 may intersect with one another in a helical fashion (e.g., portions 208 and 218 may at least partially wrap and/or coil around one another), resulting in a first inductance (L1) associated with the second portion 208 of the first trace 204 and a second inductance (L2) associated with the second portion 218 of the second trace 214. Referring again to FIG. 4, a third portion 210 of the first trace 204 and a third portion 220 of the second trace 214 may intersect with a second portion 224B of the dielectric layer 224, resulting in a third capacitance (C3) associated with the third portion 210 of the first trace 204 and a fourth capacitance (C4) associated with the third portion 220 of the second trace 214. Although the dielectric layer 224 is illustrated in the drawings as a continuous layer, in other embodiments, dielectric layer portions 224A and 224B may be separate structures (e.g., discontinuous portions of layer 224) or dielectric layer portions 224A and 224B may be separate layers.

Referring again to FIGS. 2 and 3, in an example embodiment, the PCB 202 includes a plurality of (e.g., four) holes 226 for grounding the magnetron filter board 200 and/or mounting the magnetron filter board 200 to a surface (e.g., when the magnetron filter board 200 is installed). In some embodiments, the holes 226 may pass through or may be coupled with the dielectric layer 224. For example, in an embodiment, two holes 226 may pass through or may be coupled with the first portion 224A of the dielectric layer 224, and two other holes 226 may pass through or may be coupled with the second portion 224B of the dielectric layer 224.

Figure 6:
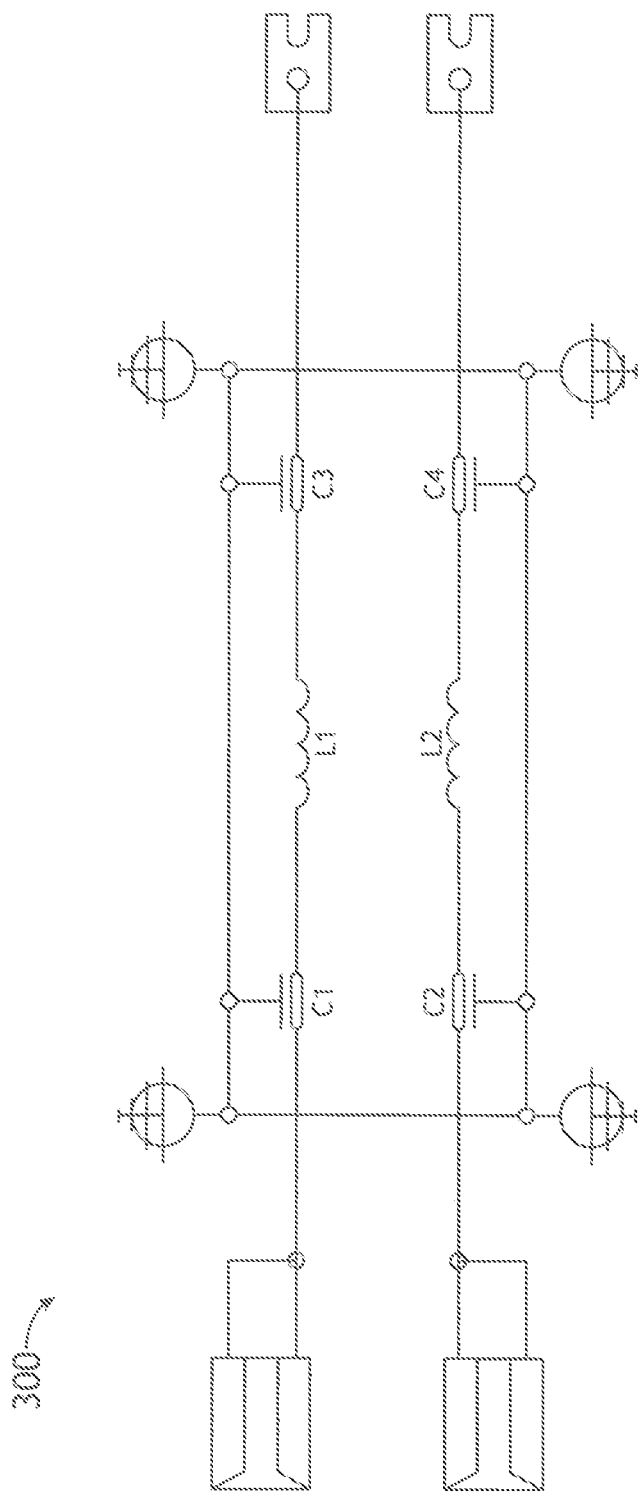
FIG. 6 is a circuit diagram illustrating a band-gap filter implemented by the magnetron filter board, in accordance with example embodiments of this disclosure.

FIG. 6 is a circuit diagram illustrating a RF band-gap filter 300 implemented by the magnetron filter board 200, in accordance with example embodiments of this disclosure. In embodiments, the RF band-gap filter 300 has a π (pi) topology, for example, as illustrated in FIG. 6, where the first capacitance (C1) associated with the first portion 206 of the first trace 204 is in series with the first inductance (L1) associated with the second portion 208 of the first trace 204 and third capacitance (C3) associated with the third portion 210 of the first trace 204, and where the second capacitance (C2) associated with the first portion 216 of the second trace 214 is in series with the second inductance (L2) associated with the second portion 218 of the second trace 214 and the fourth capacitance (C4) associated with the third portion 220 of the second trace 214.

In an example embodiment, the capacitance values are determined as follows:

$$C = \varepsilon r^* \varepsilon 0^* A/D,$$

where $\varepsilon 0$=Constant $8.854 \times 10^{-12}$, $\varepsilon r$=the dielectric constant (Dk) of the material, A=the overlapping surface area of the plates (m$^2$), D=the distance between the plates (m), and C=the capacitance.

In an example embodiment, the inductance values are determined as follows:

$$L = 2.0 \times 10^{-3} \times l \left[ \ln\left(\frac{2.0l}{w+t}\right) + 0.5 + 0.2235\left(\frac{w+t}{l}\right) \right],$$

where l is the length in cm, w is the width in cm, and t is the thickness in cm (e.g., PCB copper at 1 oz/ft$^2$=0.035 mm).

Figure 7:
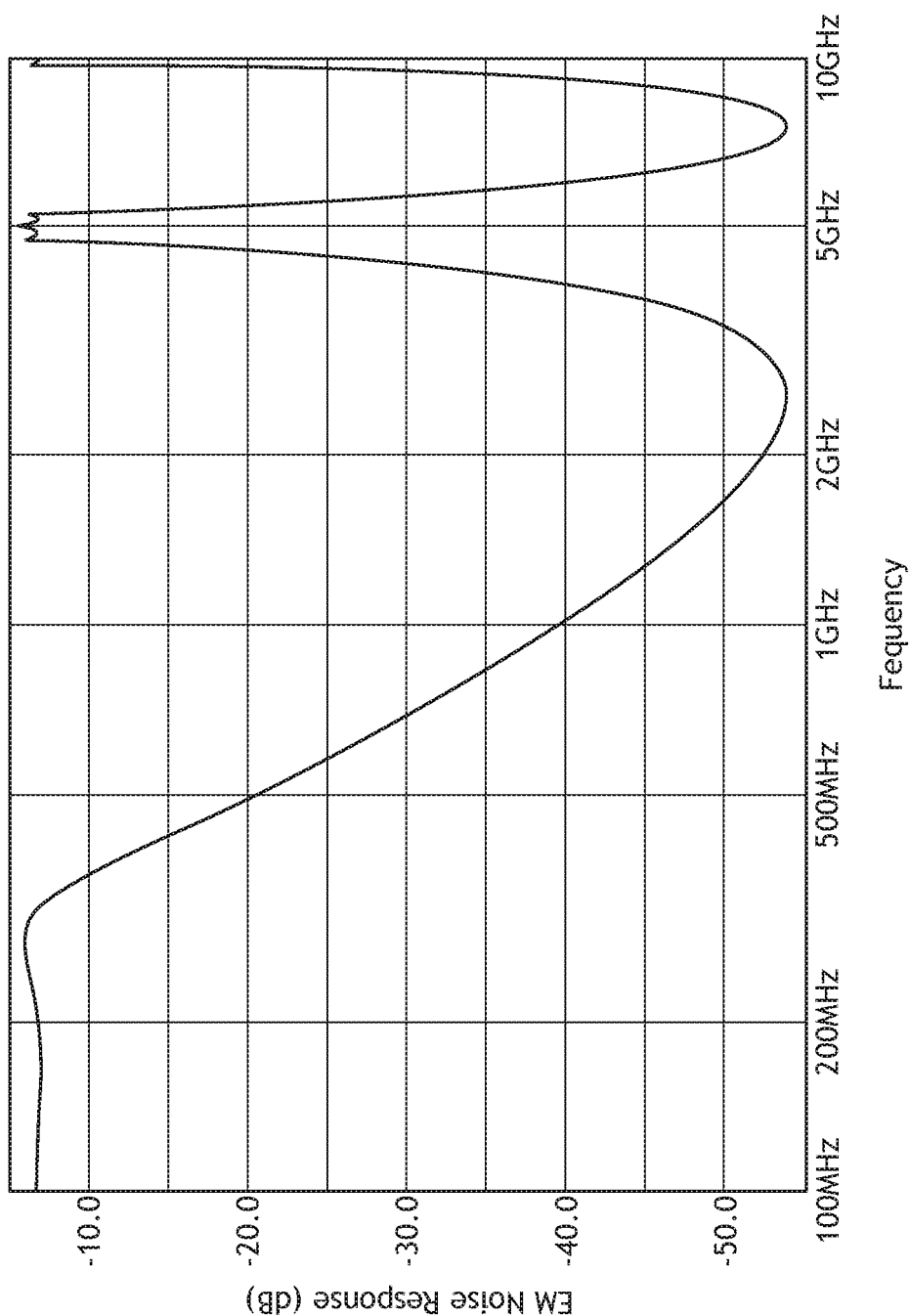
FIG. 7 is a graphical plot illustrating noise mitigation by the band-gap filter, in accordance with example embodiments of this disclosure.

In embodiments, the RF band-gap filter 300 implemented by the magnetron filter board 200 is configured to mitigate EM noise associated with the connection between the magnetron 108 and the PSU 104 by attenuating noise radiated from the magnetron 108 through the connection between the magnetron 108 and the PSU 104. For example, the RF band-gap filter 300/magnetron filter board 200 may be configured to attenuate EM noise occurring at an operating frequency in the ISM band, for example, at frequencies near 2.45 GHz and/or 7.5 GHz (e.g., in the range of approximately 2.4 to 2.6 GHz and/or 7.4 to 7.6 GHz). In an example embodiment, the RF band-gap filter 300/magnetron filter board 200 may be configured to attenuate the EM noise generated at such frequencies by a factor of at least 20 dB, at least 30 dB, at least 40 dB, or more. For example, FIG. 7 is a graphical plot illustrating noise mitigation at 2.45 GHz and 7.5 GHz.

In an example use scenario, when the magnetron 108 generates microwave radiation, the connectors (e.g., cables) connecting the PSU 104 to respective connectors (e.g., leads) of the magnetron 108 may radiate EM noise throughout and possibly beyond the microwave oven 100. In such case, the magnetron filter board 200 serves to mitigate the EM noise emissions by attenuating EM noise that may be radiated from the magnetron 108 through PSU 104 connectors (e.g., cables) between the magnetron 108 and the PSU 104.

From the above description, it is clear that the inventive concepts disclosed herein are well adapted to achieve the objectives and to attain the advantages mentioned herein as well as those inherent in the inventive concepts disclosed herein. While presently preferred embodiments of the inventive concepts disclosed herein have been described for purposes of this disclosure, it will be understood that numerous changes may be made which will readily suggest themselves to those skilled in the art and which are accomplished within the broad scope and coverage of the inventive concepts disclosed and claimed herein.

What is claimed is:
1. A magnetron filter board, comprising:
a printed circuit board;
a first trace on the printed circuit board, the first trace including a first end for connecting to a magnetron and a second end for connecting to a power supply unit; and
a second trace on the printed circuit board, the second trace including a first end for connecting to the magnetron and a second end for connecting to the power supply unit, the first trace and the second trace configured as a radio frequency band-gap filter,
wherein the printed circuit board includes a dielectric layer disposed thereon, with a first portion of the dielectric layer intersecting with a first portion of the first trace and a first portion of the second trace, resulting in a first capacitance associated with the first portion of the first trace and a second capacitance associated with the first portion of the second trace, and
a second portion of a dielectric layer intersecting with a third portion of the first trace and a third portion of the second trace, resulting in a third capacitance associated with the third portion of the first trace and a fourth capacitance associated with the third portion of the second trace, wherein the second portion of the first trace and the second portion of the second trace intersect with one another in a helical fashion, resulting in a first inductance associated with the second portion of the first trace and a second inductance associated with the second portion of the second trace, wherein the first capacitance is in series with the first inductance and the third capacitance and the second capacitance is in series with the second inductance and the fourth capacitance, wherein the frequency band-gap filter is configured to mitigate noise associated with the connection between the magnetron and the power supply unit.

2. The magnetron filter board of claim 1, wherein the first end of the first trace is configured to connect to a first terminal of the magnetron, and the first end of the second trace is configured to connect to a second terminal of the magnetron.

3. The magnetron filter board of claim 1, wherein the second end of the first trace is configured to connect to a first terminal of the power supply unit, and the second end of the second trace is configured to connect to a second terminal of the power supply unit.

4. The magnetron filter board of claim 1, wherein the radio frequency band-gap filter has a $\pi$ (pi) topology.

5. The magnetron filter board of claim 1, wherein the radio frequency band-gap filter is configured to mitigate noise associated with the connection between the magnetron and the power supply unit by attenuating noise radiated from the magnetron through the connection between the magnetron and the power supply unit.

6. The magnetron filter board of claim 5, wherein the radio frequency band-gap filter is configured to attenuate the noise radiated from the magnetron through the connection between the magnetron and the power supply unit by a factor of at least 40 dB.

7. The magnetron filter board of claim 1, wherein the first trace and the second trace are configured to withstand a voltage load of 4 kV and a current load of 6 A.

8. The magnetron filter board of claim 1, wherein the dielectric layer is a continuous layer.

9. The magnetron filter board of claim 1, wherein the first portion and the second portion of the dielectric layer are separate structures or discontinuous portions of the dielectric layer.

10. The magnetron filter board of claim 1, wherein the dielectric layer is made of a glass-reinforced epoxy laminate material.

11. A microwave oven, comprising:
a cooking chamber;
a magnetron configured to generate microwave radiation for the cooking chamber;
a power supply unit configured to power the magnetron;
a magnetron filter board connecting the magnetron to the power supply unit, the magnetron filter board comprising:
a printed circuit board;
a first trace on the printed circuit board, the first trace including a first end for connecting to a magnetron and a second end for connecting to a power supply unit; and
a second trace on the printed circuit board, the second trace including a first end for connecting to the magnetron and a second end for connecting to the power supply unit, the first trace and the second trace configured as a radio frequency band-gap filter,
wherein the printed circuit board includes a dielectric layer disposed thereon, with a first portion of the dielectric layer intersecting with a first portion of the first trace and a first portion of the second trace, resulting in a first capacitance associated with the first portion of the first trace and a second capacitance associated with the first portion of the second trace, and a second portion of a dielectric layer intersecting with a third portion of the first trace and a third portion of the second trace, resulting in a third capacitance associated with the third portion of the first trace and a fourth capacitance associated with the third portion of the second trace, wherein the second portion of the first trace and the second portion of the second trace intersect with one another in a helical fashion, resulting in a first inductance associated with the second portion of the first trace and a second inductance associated with the second portion of the second trace, wherein the first capacitance is in series with the first inductance and the third capacitance and the second capacitance is in series with the second inductance and the fourth capacitance,
wherein the frequency band-gap filter is configured to mitigate noise associated with the connection between the magnetron and the power supply unit.

12. The microwave oven of claim 11, wherein the first end of the first trace is configured to connect to a first terminal of the magnetron, and the first end of the second trace is configured to connect to a second terminal of the magnetron.

13. The microwave oven of claim 11, wherein the second end of the first trace is configured to connect to a first terminal of the power supply unit, and the second end of the second trace is configured to connect to a second terminal of the power supply unit.

14. The microwave oven of claim 11, wherein the radio frequency band-gap filter has a $\pi$ (pi) topology.

15. The microwave oven of claim 11, wherein the radio frequency band-gap filter is configured to mitigate noise associated with the connection between the magnetron and the power supply unit by attenuating noise radiated from the magnetron through the connection between the magnetron and the power supply unit.

16. The microwave oven of claim 15, wherein the radio frequency band-gap filter is configured to attenuate the noise radiated from the magnetron through the connection between the magnetron and the power supply unit by a factor of at least 40 dB.

17. The microwave oven of claim 11, wherein the first trace and the second trace are configured to withstand a voltage load of 4 kV and a current load of 6 A.

18. The microwave oven of claim 11, wherein the dielectric layer is a continuous layer.

19. The microwave oven of claim 11, wherein the first portion and the second portion of the dielectric layer are separate structures or discontinuous portions of the dielectric layer.

20. The microwave oven of claim 11, wherein the dielectric layer is made of a glass-reinforced epoxy laminate material.

* * * * *